(12) United States Patent
Shang et al.

(10) Patent No.: US 9,570,334 B2
(45) Date of Patent: Feb. 14, 2017

(54) METHOD AND SYSTEM FOR POSITIONING WAFER IN SEMICONDUCTOR MANUFACTURING FABRICATION

(71) Applicant: Taiwan Semiconductor Manufacturing Co., Ltd., Hsin-Chu (TW)

(72) Inventors: Yao-Yuan Shang, Taichung (TW); Kuo-Shu Tseng, New Taipei (TW); Chune-Te Yang, Erlin Township, Changhua County (TW); Chi-Hsin Chan, Taichung (TW); Chung-Jhieh Chen, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/674,120

(22) Filed: Mar. 31, 2015

(65) Prior Publication Data
US 2016/0293471 A1 Oct. 6, 2016

(51) Int. Cl.
| | |
|---|---|
| *H01L 21/68* | (2006.01) |
| *G06T 7/00* | (2006.01) |
| *H01L 21/67* | (2006.01) |
| *H01L 21/687* | (2006.01) |
| *H01L 21/02* | (2006.01) |
| *H01L 21/027* | (2006.01) |
| *H01L 21/66* | (2006.01) |
| *H01L 21/677* | (2006.01) |

(52) U.S. Cl.
CPC .......... *H01L 21/681* (2013.01); *G06T 7/0004* (2013.01); *G06T 7/0044* (2013.01); *H01L 21/02052* (2013.01); *H01L 21/0271* (2013.01); *H01L 21/67051* (2013.01); *H01L 21/67259* (2013.01); *H01L 21/67742* (2013.01); *H01L 21/68707* (2013.01); *H01L 22/26* (2013.01); *G06T 2207/30148* (2013.01)

(58) Field of Classification Search
CPC .. H01L 21/681; H01L 21/67051; H01L 22/26; H01L 21/02052; H01L 21/67742; H01L 21/0271; H01L 21/68707; H01L 21/67259; H01L 21/67207; H01L 21/68; H01L 21/67748; H01L 22/10; H01L 21/673; H01L 21/677; H01L 51/56; G06T 7/0004; G06T 7/0044; G06T 2207/30148; G05B 2219/45031; G06F 7/00
USPC .......................................................... 438/14
See application file for complete search history.

(56) References Cited

U.S. PATENT DOCUMENTS

2012/0154822 A1\* 6/2012 Kiley ................... B65G 25/02
356/614

\* cited by examiner

*Primary Examiner* — Caleen Sullivan
(74) *Attorney, Agent, or Firm* — McClure, Qualey & Rodack, LLP (57) ABSTRACT

A method for positioning a wafer in semiconductor fabrication is provided. The method includes sending a wafer into a processing chamber by a transferring module. The method further includes producing a video image in relation to an edge of the wafer by a monitoring module. The method also includes performing an image analysis on the video image to determine if the edge of the wafer is in a correct position. If the edge of the wafer is not in a correct position a shifting value is calculated and the wafer is moved according to the shifting value.

18 Claims, 12 Drawing Sheets

METHOD AND SYSTEM FOR POSITIONING WAFER IN SEMICONDUCTOR MANUFACTURING FABRICATION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, the processes include coating a photoresist on the semiconductor wafer. After a photoresist material is coated, exposed and developed on the semiconductor wafer surface, an edge bead rinse (EBR) process is frequently performed before the semiconductor wafer can be processed further.

Although existing methods and devices for operating the processing steps have generally been adequate for their intended purposes, they have not been entirely satisfactory in all respects. Consequently, it would be desirable to provide a solution for the process control for semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 1:
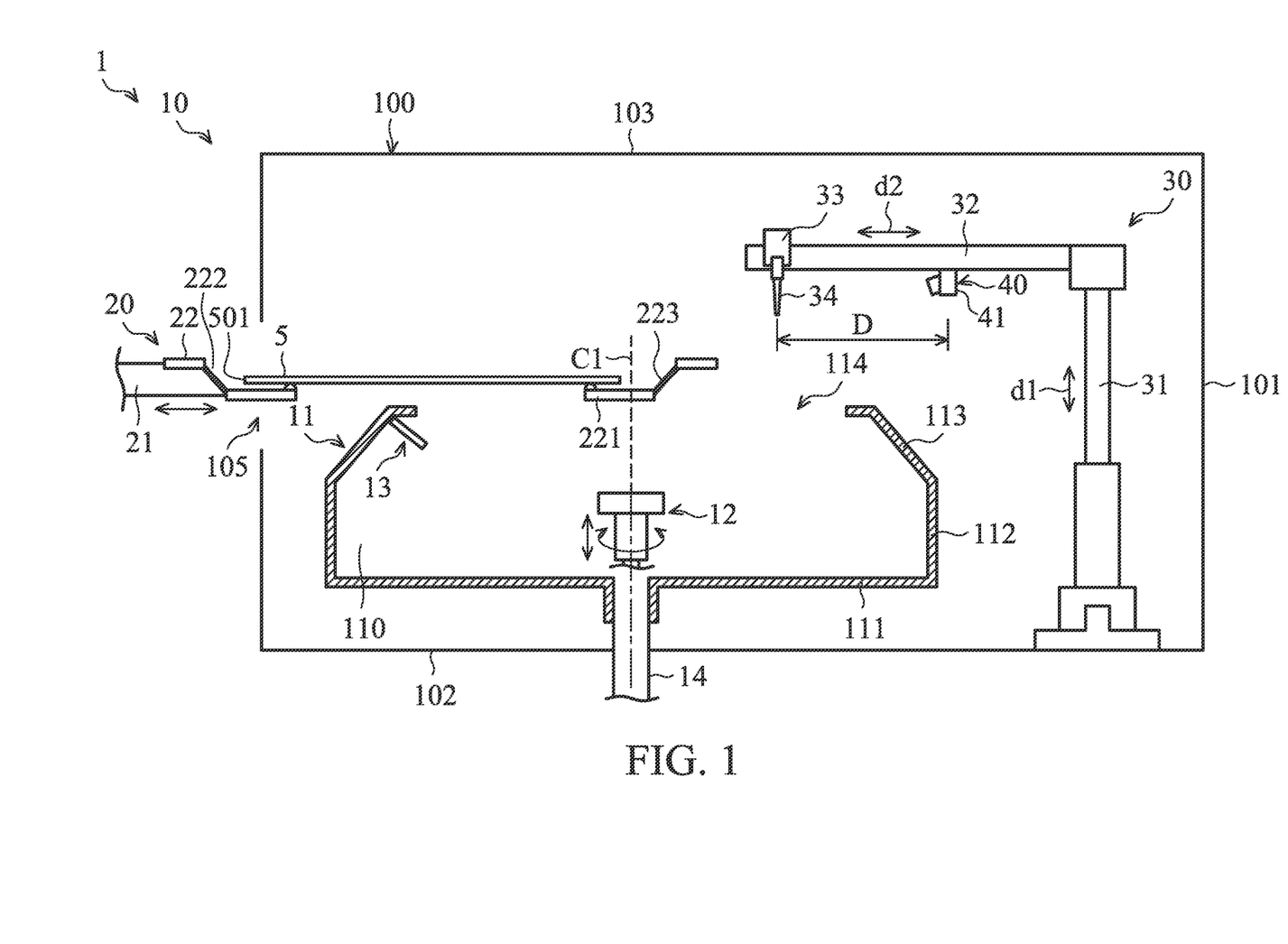
FIG. 1 is cross-sectional view of a wafer processing system, in accordance with some embodiments.
Figure 2:
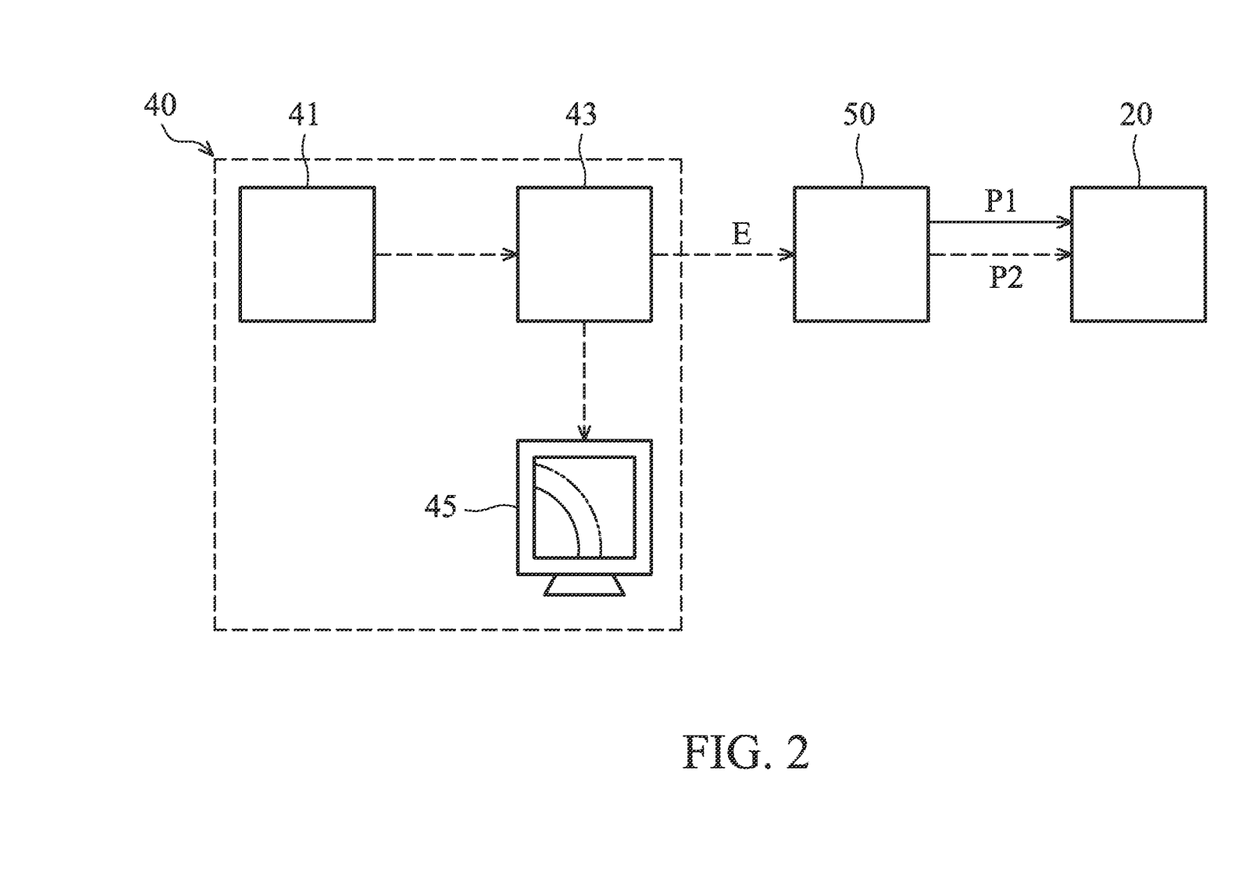
FIG. 2 is a block diagram of a wafer processing system, in accordance with some embodiments.

FIG. 1 is cross-sectional view of a wafer processing system 1 for processing a wafer 5, in accordance with some embodiments. FIG. 2 is a block diagram of the wafer processing system 1, in accordance with some embodiments. The wafer processing system 1 includes a processing chamber 10, a transferring module 20, a liquid dispensing module 30, a monitoring module 40, and a control module 50 (FIG. 2). In some embodiments, the wafer processing system 1 is configured to coat a liquid film (such as a photoresist) on the wafer 5. However, it should be appreciated that many variations and modifications can be made to embodiments of the disclosure.

The wafer 5 may be made of silicon or other semiconductor materials. Alternatively or additionally, the wafer 5 may include other elementary semiconductor materials such as germanium (Ge). In some embodiments, the wafer 5 is made of a compound semiconductor such as silicon carbide (SiC), gallium arsenic (GaAs), indium arsenide (InAs), or indium phosphide (InP). In some embodiments, the wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the wafer 5 includes an epitaxial layer. For example, the wafer 5 has an epitaxial layer overlying a bulk semiconductor. In some other embodiments, the wafer 5 may be a silicon-on-insulator (SOI) or a germanium-on-insulator (GOI) substrate.

The wafer 5 may have various device elements. Examples of device elements that are formed in the wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The processing chamber 10 has an interior space 100 defined by a number of walls, such as a lateral wall 101, a bottom wall 102, and a top wall 103. The lateral wall 101 is connected to edges of the bottom wall 102 and extends away from the bottom wall 102. The top wall 103 is connected to the distal end of the lateral wall 101. In some embodiments, the interior space 100 is secluded from the ambient environment. The interior space 100 communicates to the ambient environment via a slot 105 formed on the lateral wall 101. The slot 105 allows the transferring module 20 to pass through.

The processing chamber 10 further includes a catch cup 11, a wafer stage 12, and an EBR nozzle 13, in accordance with some embodiments. The catch cup 11, the wafer stage 12, and the EBR nozzle 13 are positioned in the interior space 100.

In some embodiments, the catch cup 11 is configured to provide an environment for depositing a photoresist film on the wafer 5 and developing the exposed photoresist film deposited on the wafer 5. The catch cup 11 is a circular cup having an open top 114. The upper portion 113 of the cup wall 112 tilts inward to facilitate retaining waste photoresist within the catch cup 11. The catch cup 11 is connected to an exhaust system via a liquid waste drain 14 formed on the bottom wall 102. As a result, the catch cup 11 is able to catch and drain waste liquid solution in a liquid film coating process via the liquid waste drain 14.

The wafer stage 12 is disposed in the catch cup 11. In some embodiments, the wafer stage 12 is configured for holding, positioning, moving, and otherwise manipulating the wafer 5. In some embodiments, the wafer stage 12 is arranged to move along a main axis C1. The wafer 5 may be secured on the wafer stage 12 by a clamping mechanism, such as vacuum clamping or e-chuck clamping. The wafer stage 12 is designed and configured to be operable for translational and rotational motions. In some embodiments, the wafer stage 12 is further designed to tilt or dynamically change the tilt angle. In some embodiments, the wafer stage 12 is fitted with a suitable heating mechanism to heat the wafer 5 to a desired temperature.

In some embodiments, the EBR nozzle 13 is disposed in the catch cup 11. The EBR nozzle 13 is used to supply a liquid solution over the wafer 5, when the wafer 5 is disposed in the catch cup 11. The EBR nozzle 13 is connected to a source unit (not shown in figures) to receive the chemical solution from the source unit.

The transferring module 20 includes one or more driving elements (not shown in figures), a robot arm 21, and a robot blade 22, in accordance with some embodiments. The driving element, such as a motor, is controlled by the control module 50 and is coupled to the robot arm 21. The robot arm 21 is driven by the driving element to provide both radial and rotational movement of the robot blade 22 in a fixed plane to pick up, transfer, and deliver the wafer 5 from one location within the wafer processing system 1 to another.

For example, with the transferring module 20, the wafer 5 is transferred between a carrier, such as a FOUP, and the processing chamber 10. In some other embodiments, the wafer 5 is transferred between the processing chamber 10 and one or more processing chambers (not shown in figures) of the wafer processing system 1 by the transferring module 20.

The robot blade 22 includes a base portion 221, and a number of wafer block portions, such as the two wafer block portions 222 and 223, in accordance with some embodiments. The robot blade 22 can be formed in any shape and size according to need. In some embodiments, the robot blade 22 has a U-shape configuration and has very little thickness. The thickness of the robot blade 22 ranges from about 2 mm to about 3 mm, so as to go through a narrow slot 105 for delivering or withdrawing the wafer 5 to and from a destination. In some other embodiments, the robot blade 22 normally has an elongated construction in a rectangular shape.

The wafer block portions 222 and 223 are arranged on the base portion 221. The upper surface corresponding to each of the wafer block portions 222 and 223 is higher than the upper surface corresponding to the base portion 221 by, for instance, approximately 0.3 mm. In some embodiments, a connecting line between wafer block portions 222 and 223 passing through a center of a circle. The wafer block portions 222 and 223 are separated by a distance to conform to the shape of the wafer 5 being transferred.

The liquid dispensing module 30 includes one or more driving elements (not shown in figures), a first drive mechanism 31, a second drive mechanism 32, a nozzle holder 33, and a dispensing nozzle 34, in accordance with some embodiments. The driving element, such as a motor, is controlled by the control module 50 and is coupled to the first drive mechanism 31 and the second drive mechanism 32. The driving element is used to actuate the first drive mechanism 31 to move in a vertical direction, as indicated by the arrow d1 shown in FIG. 1. Additionally or alternatively, the driving element is used to actuate the second drive mechanism 32 to move in a horizontal direction, as indicated by the arrow d2 shown in FIG. 1. In some embodiments, the first drive mechanism 31 is rotatable about a vertical axis.

The nozzle holder 33 is positioned at the liquid dispensing module 30 such that the nozzle holder 33 is moved into a particular position in the processing chamber 10. In some embodiments, the nozzle holder 33 is mounted at a distal end of the second drive mechanism 32. The nozzle holder 33 is used to hold the dispensing nozzle 34. The dispensing nozzle 34 is used to apply a chemical solution to the wafer 5. The dispensing nozzle 34 is connected to a source unit (not shown in figures) to receive the chemical solution from the source unit.

Referring to FIGS. 1 and 2, the monitoring module 40 includes an optical receiver 41, an image processor 42 (FIG. 2), and an image display 43 (FIG. 2), in accordance with some embodiments. As shown in FIG. 1, the optical receiver 41 is positioned at the liquid dispensing module 30 such that the optical receiver 41 is moved to a particular position in the processing chamber 10. In some embodiments, the optical receiver 41 is mounted at the second drive mechanism 32. In some embodiments, the distance D between the nozzle holder 33 and the optical receiver 41 is approximately equal to half of the distance between the two wafer blocks portions 222 and 223. Namely, the distance D is approximately equal to the radius of the wafer 5. In some embodiments, for the optical receiver 41 having a wide angle lens, the distance D is in a range from about 9 cm to about 15 cm. However, it should be appreciated that many variations and modifications can be made to embodiments of the disclosure.

The optical receiver 41 is used to investigate particular objects or locations in the processing chamber 10. In some embodiments, the optical receiver 41 includes a charge-coupled device (CCD). The CCD is a highly sensitive photon detector. The CCD is divided into a large number of small, light-sensitive areas (known as pixels) which can be used to build up an image of the scene of interest. A photon of light that falls within the area defined by one of the pixels will be converted into one (or more) electrons, and the number of electrons collected will be directly proportional to the intensity of the scene at each pixel. When the CCD is clocked out, the number of electrons in each pixel are measured and the scene can be reconstructed As shown in FIG. 2, the image processor 42 is connected to the optical receiver 41 to receive the electronic signal from the optical receiver 41. Then the image processor 42 analyzes the image to produce image information data regarding the image investigated by the optical receiver 41. The image display 43 is connected to the image processor 42 and is configured to show a video image investigated by the optical receiver 41.

The control module 50 is configured to send control data to the transferring module 20 and the dispensing module 30. The transferring module 20 and the dispensing module 30 are operated according to the control data. In some embodiments, the control data from the control module 50 is related to the image information data from the image processor 42.

Figure 3:
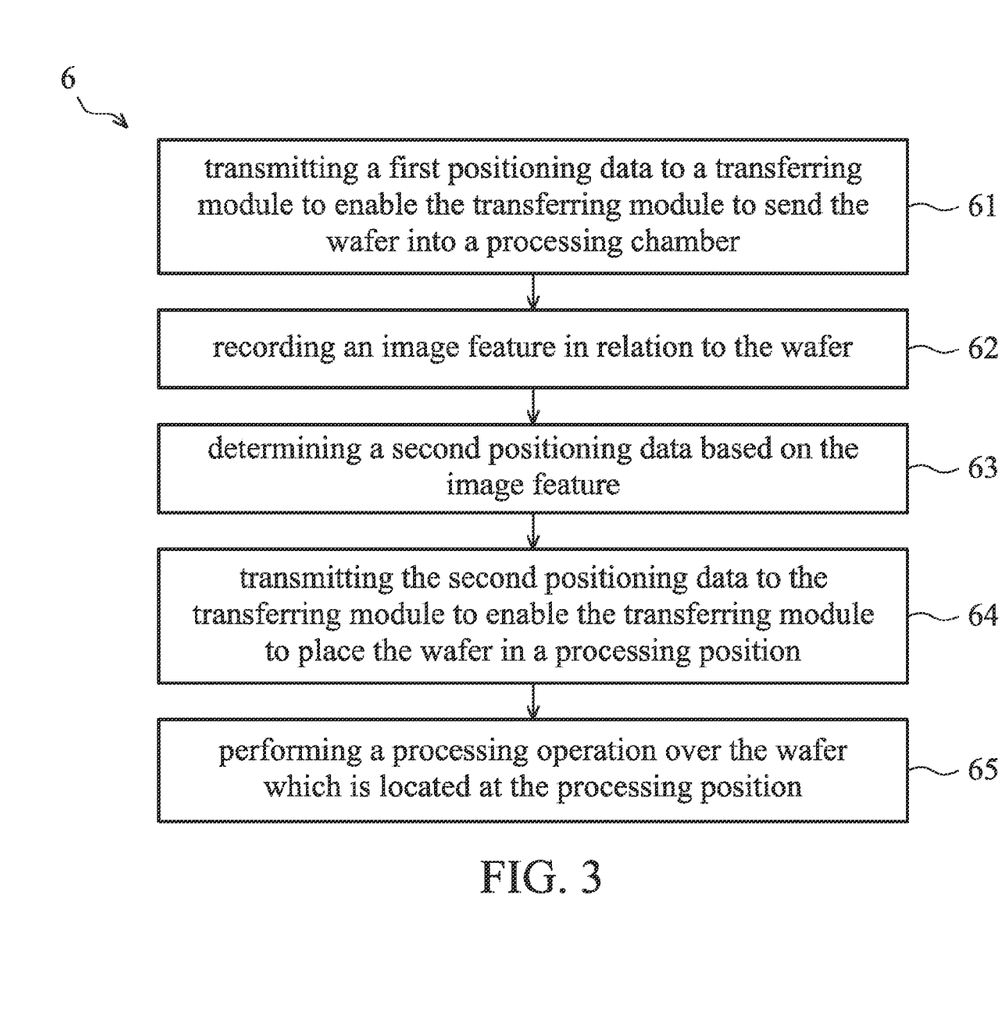
FIG. 3 is a flow chart of methods for positioning a wafer, in accordance with some embodiments.
Figure 4:
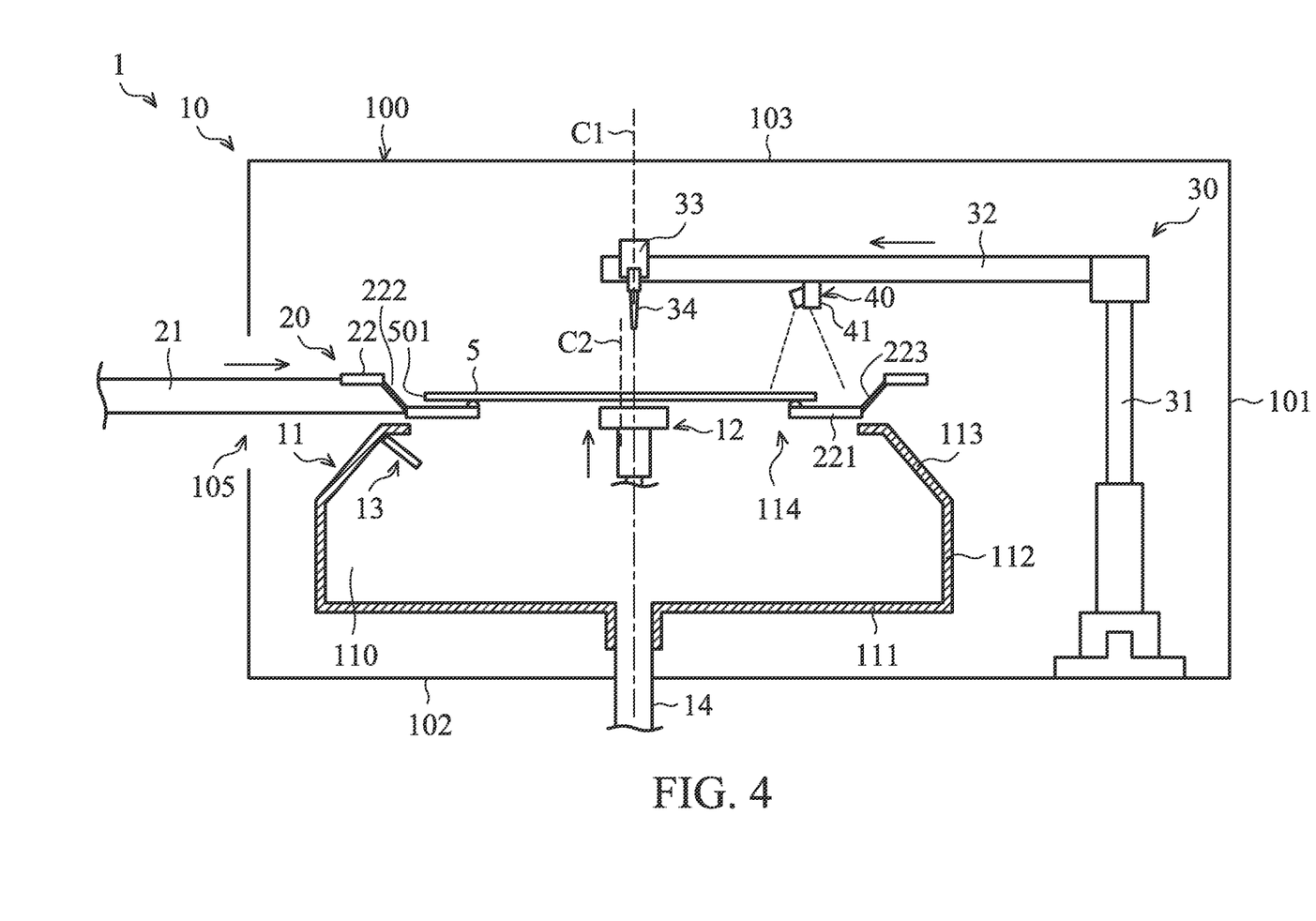
FIG. 4 is a cross-sectional view of one coating stage of a process for positioning a wafer in a wafer processing system, in accordance with some embodiments.
Figure 6:
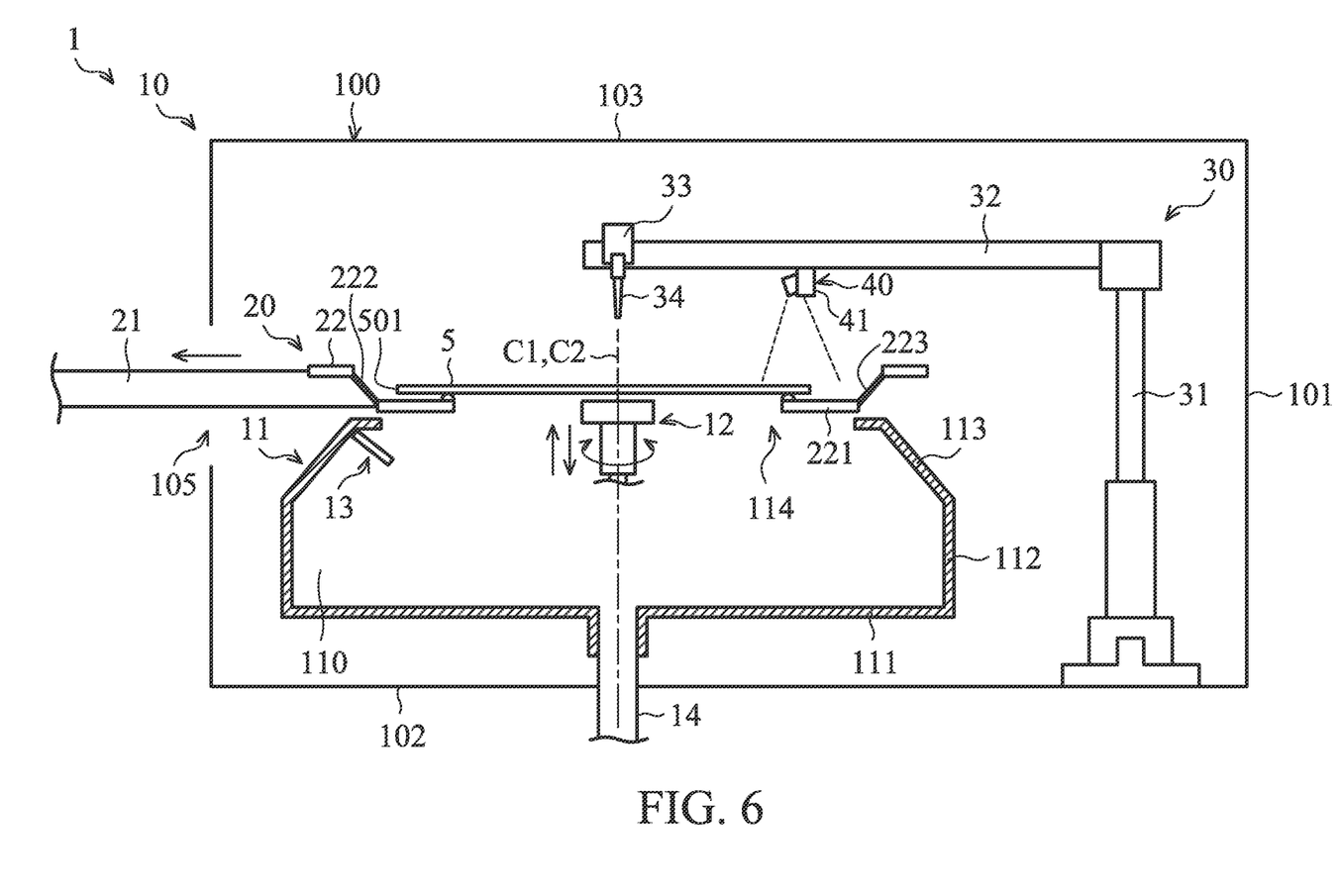
FIG. 6 is a cross-sectional view of one coating stage of a process for positioning a wafer in a wafer processing system, in accordance with some embodiments.

FIG. 3 is a flow chart illustrating a method 6 for cleaning a wafer, in accordance with some embodiments. FIGS. 4 and 6 are cross-sectional views of operation stages of a process for positioning the wafer 5, in accordance with some embodiments. For illustration, the flow chart will be described in company with the schematic views shown in FIGS. 2, 4 and 6. Some of the stages described can be replaced or eliminated for different embodiments. Additional features can be added in the semiconductor device structure. Some of the features described below can be replaced or eliminated for different embodiments.

The method 6 begins with an operation 61 in which first positioning data P1 is transmitted to a transferring module (such as transferring module 20) to enable the transferring module 20 to send a wafer (such as wafer 5) into a processing chamber (such as processing chamber 10). In some embodiments, as shown in FIG. 2, the first positioning data P1 is produced by the control module 50 (FIG. 2) and transmitted to the transferring module 20. In some embodiments, the first positioning data P1 carries two-dimensional coordinates corresponding to a position in which the wafer stage 12 is located.

Referring to FIG. 4, after receipt of the first positioning data P1, the driving element of the transferring module 20 actuates the robot arm 21 to move the robot blade 22 into the interior space 100 via the slot 105.

In some embodiments, the wafer 5 is not positioned in the center of the robot blade 22, and the center of the wafer 5 is offset with a mid-point of the two wafer block portions 222 and 223. The distance between the wafer block portion 222 and the edge of the wafer 5 is shorter than the distance between the wafer block portion 223 and the edge of the wafer 5. As a result, when the operation 61 is finished, the wafer central axis C2 passing through the substantial center of the wafer 5 does not align with the main axis C1 passing the wafer stage 12. Namely, the wafer 5 is not centered relative to the wafer stage 12. In some embodiments, the wafer central axis C2 is offset from the main axis C1 for a distance of about 0 mm to about 0.4 mm.

Specific processes are carried out in the following operations. In some embodiments, the processes includes a photoresist coating process, a photoresist developing process, and an edge bead rinse process for removing an edge bead.

In the photoresist coating process, a small amount of a photoresist liquid is dispensed onto a wafer that rotates at high speed from a dispensing nozzle positioned at the center of the wafer. When the dispensing nozzle is not perfectly centered in relation to the wafer 5, incomplete coverage or even voids on the wafer surface may occur. Such poor coverage of a photoresist coating on the wafer surface results in a high scrap rate of the devices formed on the wafer, or even scrapping the whole wafer.

Afterwards, the wafer 5 is imaged in a stepper to reproduce circuits desired on the wafer. A liquid developer material is then dispensed onto the surface of the wafer 5. If the dispensing nozzle is not perfectly centered in relation to the wafer 5, the process for developing the photoresist may not be successful.

Afterwards, a photoresist material is coated, exposed and developed on the wafer surface, and an edge bead rinse (EBR) process is performed frequently before the wafer 5 can be processed further. This is due to the fact that, in most processing chambers, a clamp ring is used to hold the wafer down on a platform during a chemical or physical process. A peripheral edge on the top surface of the wafer 5 that is overlapped by the clamp ring must therefore be cleaned of the photoresist material so that no photoresist material can crack under the clamp ring, which can cause serious contamination problems. The edge bead rinse process is carried out after a photoresist coating and developing process.

An improperly centered wafer results in an unevenly washed wafer edge with one side of the wafer having excessive photoresist coating and the other side of the wafer having insufficient photoresist coating.

To avoid the situations mentioned above, the method 6 continues to operation 62 in which an image feature in relation to the wafer 5 is recorded and analyzed by a monitor module (such as monitor module 40). In some embodiments, as shown in FIG. 4, the optical receiver 41 investigates an area corresponding to the edge 501 of the wafer 5 which is adjacent to the wafer block portion 223. The image feature in relation to the wafer 5 is delivered to the image processor 42 and shown in the image display 43. In some embodiments, the image feature is a real-time video image of the wafer 5.

Afterwards, the image processor 42 performs an image analysis to determine a shifting value E for moving the wafer 5 to the correct position. In some embodiments, the image analysis includes reading the real-time video image captured by the optical receiver 41. The image analysis further includes recognizing the position of the edge 501 of the wafer 5 in the real-time image using a mathematical algorithm. In addition, the image analysis includes determining if the video image is overlapped with a template image which shows a reference line located at the correct position by matrix multiplication. If the edge 501 of the wafer 5 is not in the correct position, the shifting value E is calculated.

Figure 5:
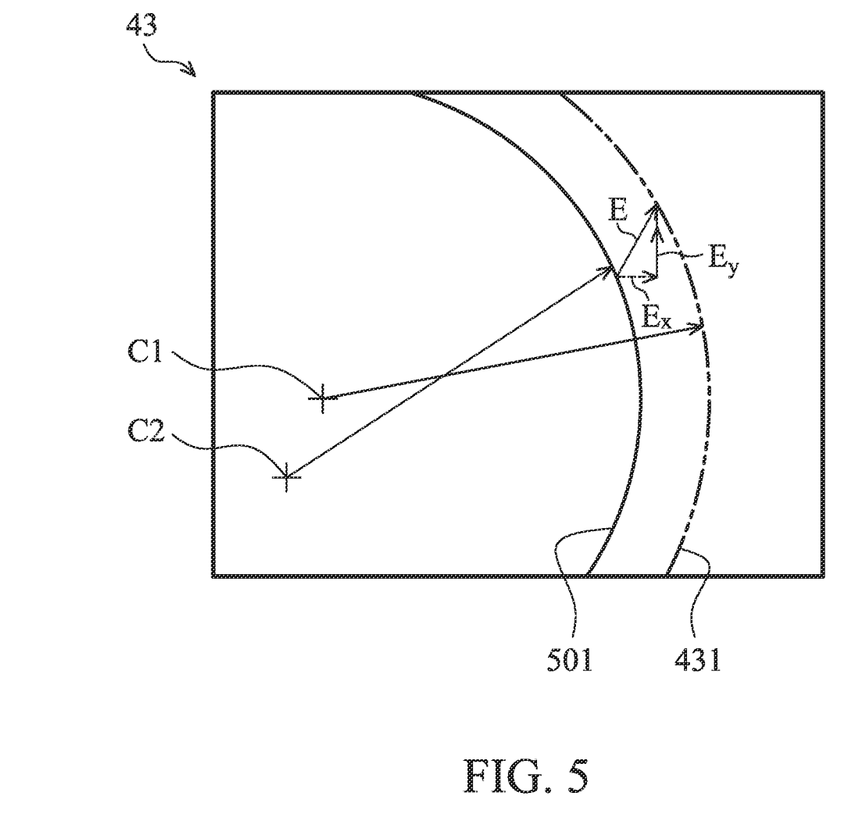
FIG. 5 is a schematic view of one display screen showing a video image before a wafer is positioned, in accordance with some embodiments.

For example, as shown in FIG. 5, the image display 43 displays the video image showing the edge 501 and a template image showing a reference line 431. The reference line 431 is a curved line having its center on the main axis C2. The curvature of the reference line 431 is as the same as that of the edge 501 of the wafer 5. As a result, the reference line 431 represents the correct position if the wafer 5 is centered relative to the main axis C2. The video image and the template image are compared by the image processor 42. If the video image does not overlap the template image (i.e., the edge 501 does not overlap the reference line 431), a shifting value E for moving the wafer 5 to the correct solution is calculated by the image processor 42.

Afterwards, the method 6 continues with an operation 63 in which second positioning data is determined by a control module (such as control module 50) based on the real-time video image processed by the monitoring module 40. In some embodiments, the shifting value E produced by the image processor 42 is delivered to the control module 50. As shown in FIG. 2, the control module 50 calculates adjusted positioning data P2 (i.e. the second positioning data) based on the shifting value E produced by the image processor 42. In some embodiments, the second positioning data P2 is equal to the sum of the first positioning data P1 and the shifting value E. That is, the second positioning data P2 meets the equation P2=P1+E. In some embodiments, the first positioning data P1 carries two-dimensional coordinates, and the shifting value E carries an X-axis shifting amount Ex and a Y-axis shifting amount Ey (FIG. 5). As a result, the second positioning data P2 also carries two-dimensional coordinates.

Afterwards, the method 6 continues with an operation 64 in which the second positioning data P2 is transmitted to the transferring module 20 to enable the transferring module 20 to place the wafer 5 in a processing position. In some embodiments, the second positioning data P2 produced by the control module 50 is delivered to the transferring module 20. After receipt of the second positioning data P2, the driving element of the transferring module 20 actuates the robot arm 21 to move the wafer 5 to an adjusted position. In some embodiments, the shifting value E is zero (i.e. the wafer 5 is in the processing position). The first positioning data P1 is the same as the second positioning data P2. No adjustment is made to the position of the wafer 5.

Figure 7:
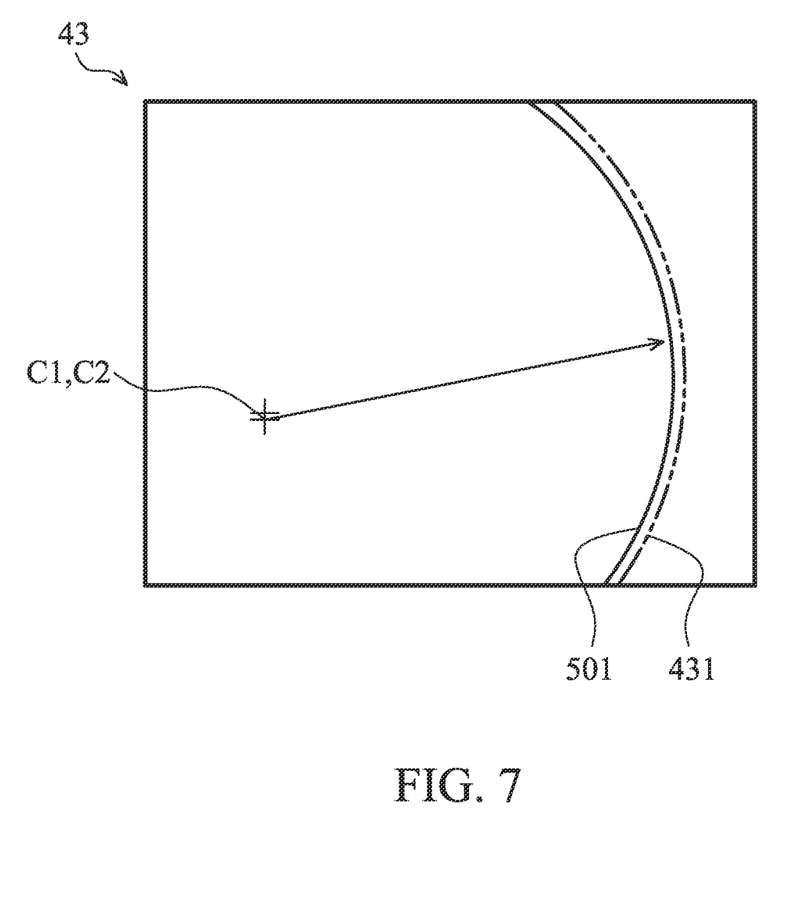
FIG. 7 is a schematic view of one display screen showing a video image after a wafer is positioned, in accordance with some embodiments.

Referring to FIG. 6, after the position of the wafer 5 is adjusted, the wafer 5 is centered relative to the wafer stage 12. The wafer central axis C2 passing through the substantial center of the wafer 5 aligns with the main axis C1 passing the wafer stage 12. While at the same time, the video image captured by the optical receiver 41 overlaps the template image (i.e., the edge 501 overlaps the reference line 431), as shown in FIG. 7.

In some embodiments, before the wafer 5 is moved to the process position as shown in FIG. 6, the monitoring module 40 continuously performs the image analysis regarding the video image in relation to the edge 501 of the wafer. As a result, the second positioning data P2 is dynamically modified while the wafer 5 moves.

As shown in FIG. 6, when the wafer 5 is in the processing position, the method 6 continues with an operation 65 in which the at least one processing operation over the wafer 5 is performed. In some embodiments, the wafer stage 12 is moved toward the wafer 5 along the main axis C2 to make contact with the bottom surface of the wafer 5. Afterward, the wafer 5 is fixed by the wafer stage 12 and unloaded from the robot blade 22, and the transferring module 20 is removed from the interior space 100 via the slot 105. Afterward, the wafer stage 12 lowers the wafer 5 into the catch cup 11 for being carried to different processing operations.

Figure 8:
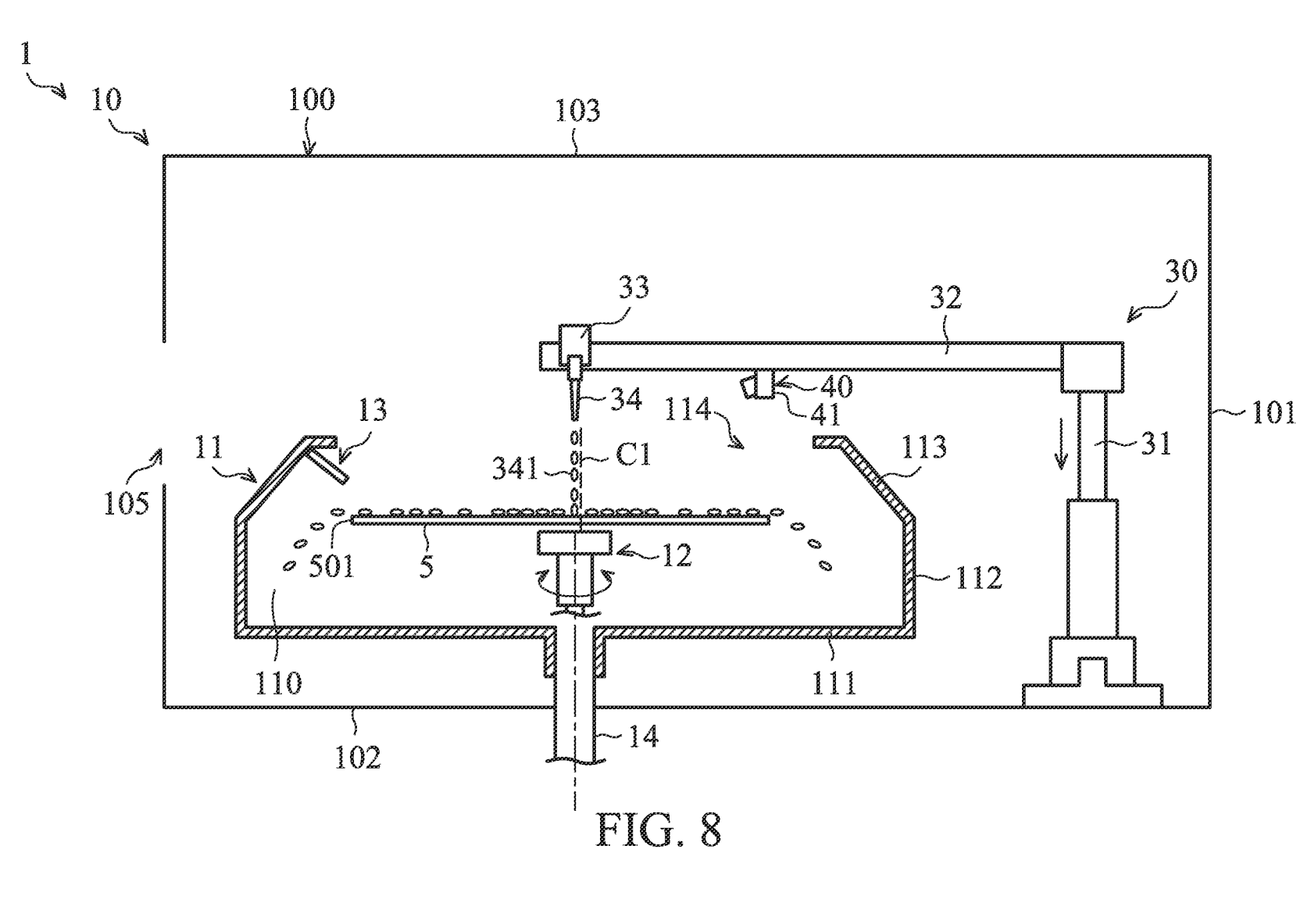
FIG. 8 is a cross-sectional view of one stage of a process for coating a photoresist on a wafer, in accordance with some embodiments.

As shown in FIG. 8, in the photoresist coating process, the first drive mechanism 31 lowers the dispensing nozzle 34 along the main axis C1. A photoresist 341 is dispensed on the wafer 5 in the catch cup 11. In some embodiments, the photoresist 341 is dispensed on the substantial center of the wafer 5 by the dispensing nozzle 34. The wafer stage 12 simultaneously rotates the wafer 5 at a rotational speed that is typically less than about 700 rpm. In some embodiments, the dispensing nozzle 34 scans across the surface of the wafer 5, and the photoresist 341 is dispensed over the wafer 5.

Figure 9:
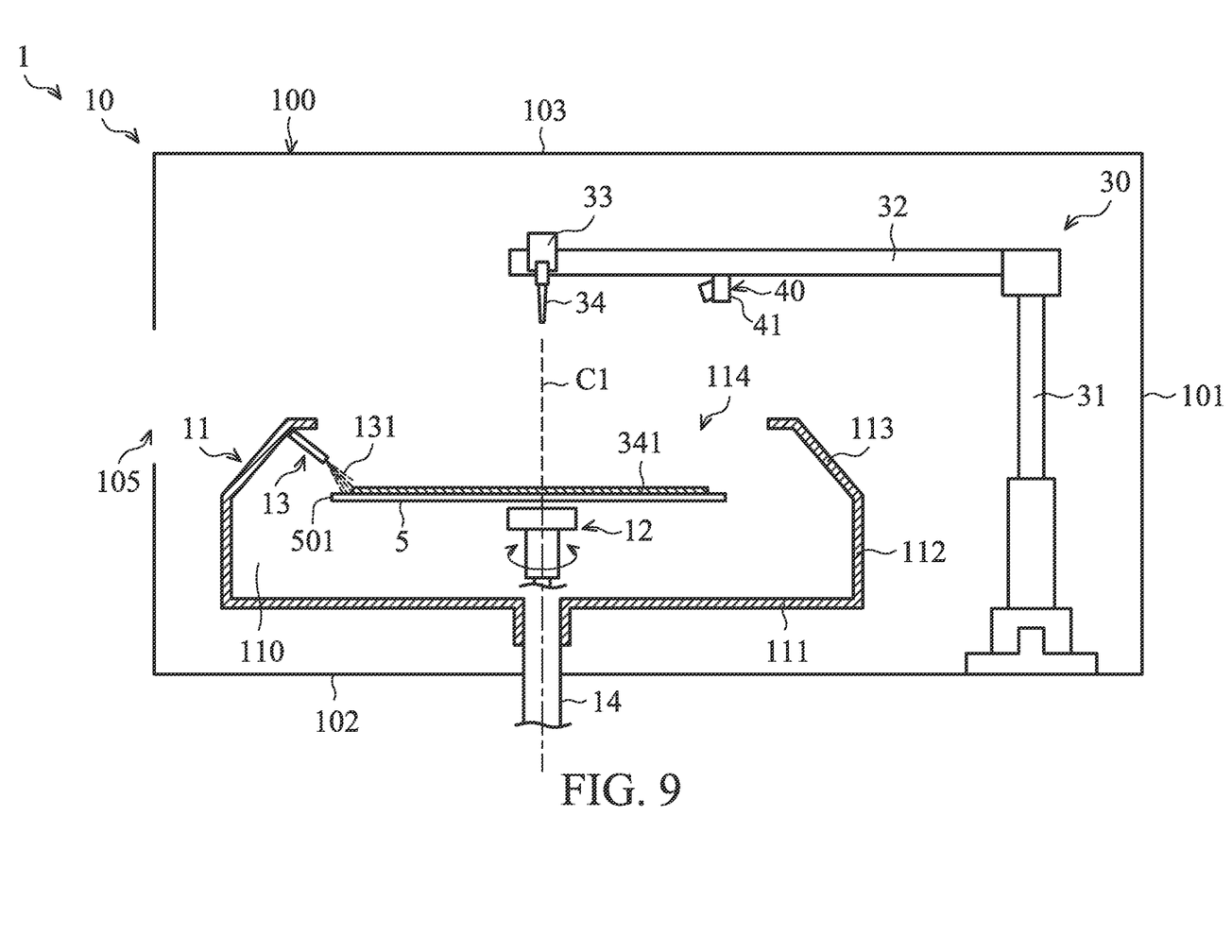
FIG. 9 is a cross-sectional view of one stage of an edge bead rinse process, in accordance with some embodiments.

As shown in FIG. 9, in an edge bead rinse process, the EBR nozzle 13 is controlled by a digital step motor and is used to supply a washing liquid 131 over a peripheral area of the wafer 5. The washing liquid 131 washes away the photoresist 341 from the wafer surface of the peripheral area while the wafer stage 12 simultaneously rotates the wafer 5.

Figure 10:
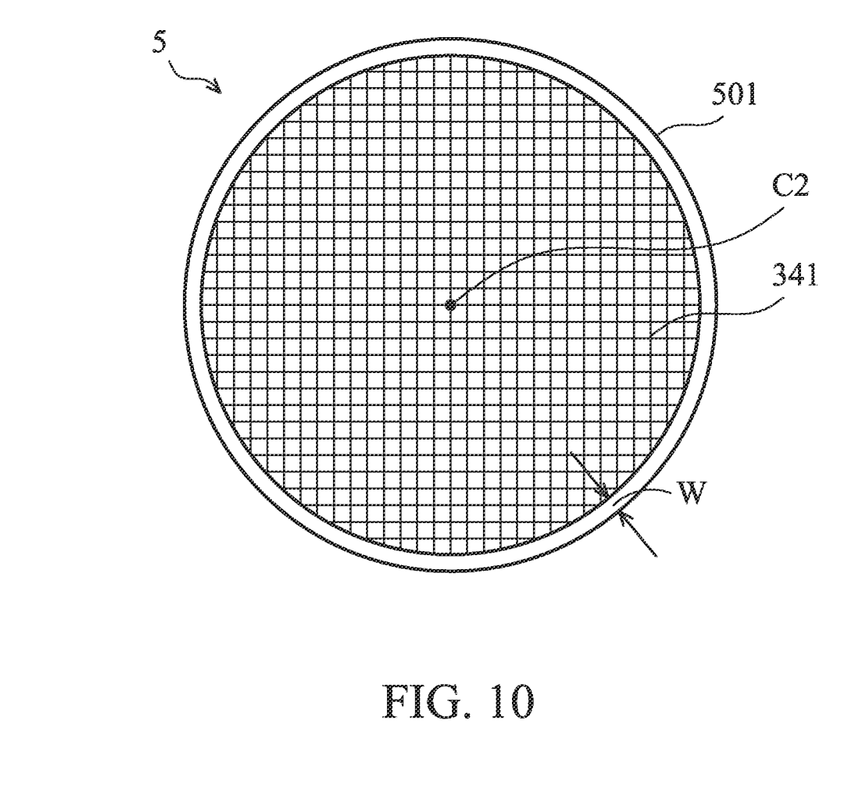
FIG. 10 is a top view of a wafer with photoresist, in accordance with some embodiments.

As shown in FIG. 10, due to the centering of the wafer 5 in relation to the wafer stage 12, an unevenly washed wafer edge with one side of the wafer having excessive photoresist coating and the other side of the wafer having insufficient photoresist coating is prevented. In some embodiments, for a 12 inch wafer 5, a width W in a range from about 1 mm to about 2 mm on the outer edge of the wafer 5 is formed for edge bead removal.

It is appreciated that the configuration of the monitoring module 40 should not be limited to the embodiments mentioned above, and the optical receiver 41 can be modified as long as the real-time video image of the wafer 5 can be monitored.

Figure 11:
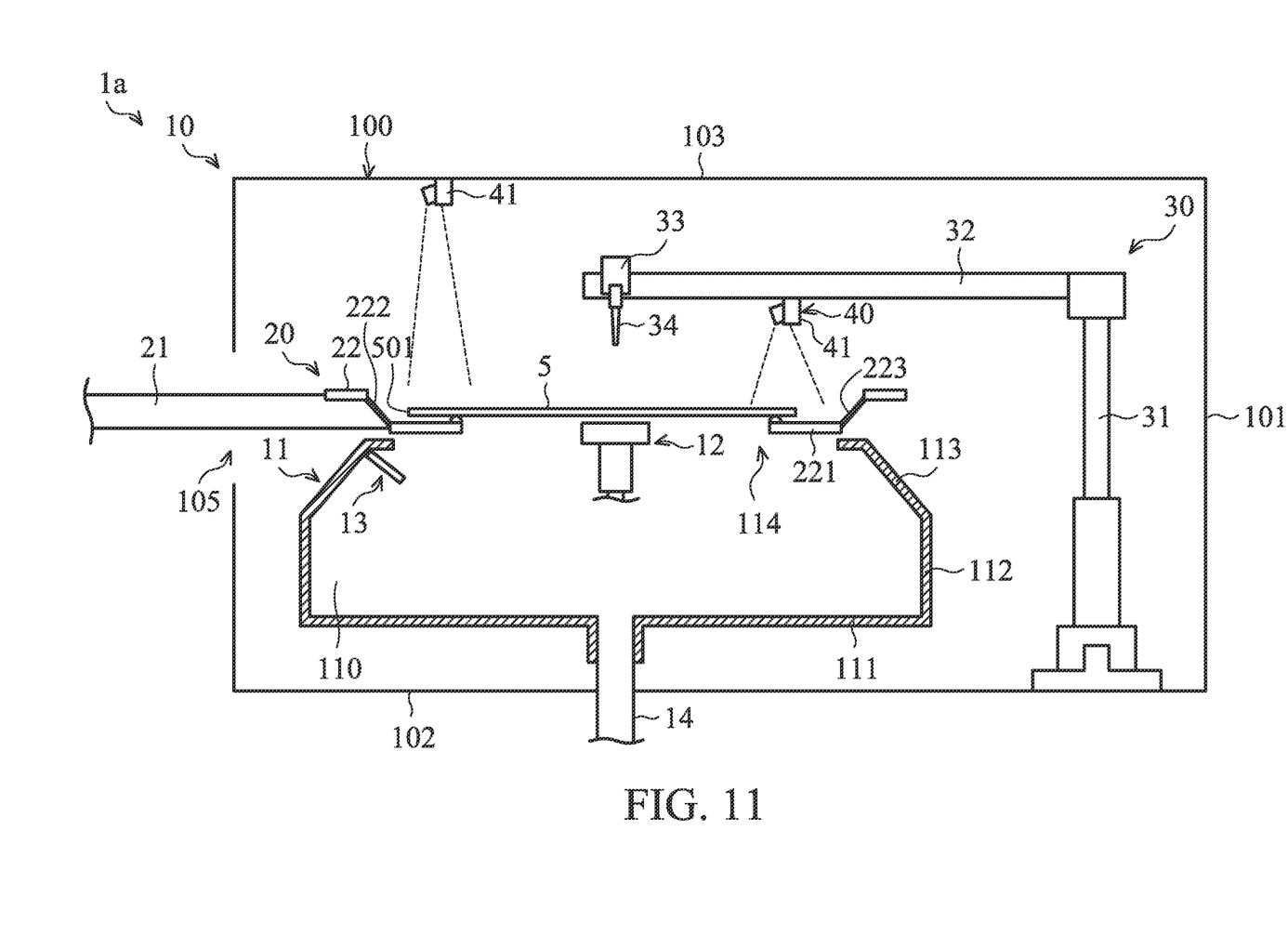
FIG. 11 is a cross-sectional view of a wafer processing system, in accordance with some embodiments.

FIG. 11 shows a cross-sectional view of a wafer processing system 1a, in accordance with some embodiments. In some embodiments, differences between the wafer processing system 1a and the wafer processing system 1 shown in FIG. 1 include the monitoring module 40a including a plurality of optical receivers 41.

In some embodiments, the monitoring module 40a includes two optical receivers 41. One optical receiver 41 is positioned on the second drive mechanism 32 of the dispensing module 30. This optical receiver 41 is configured to monitor the edge 501 of the wafer 5 adjacent to the wafer blocks portion 223. Another optical receiver 41 is positioned on the top wall 103 of the interior space 100. This optical receiver 41 is configured to monitor the edge 501 of the wafer 5 adjacent to the wafer blocks portion 222.

In some embodiments, video images recorded by the two optical receivers 41 are transmitted simultaneously to the image processor 42 for image analysis. In some embodiments, one of the optical receivers 41 is used to record a video image, and another optical receiver 41 is shut down. In some embodiments, the optical receiver 41 positioned on the second drive mechanism is omitted. Two or more optical receivers 41 are mounted on the walls of the interior space 100. With more optical receivers 41, more real-time video images of the wafer 5 are recorded. Therefore, the wafer 5 can be positioned precisely.

Figure 12:
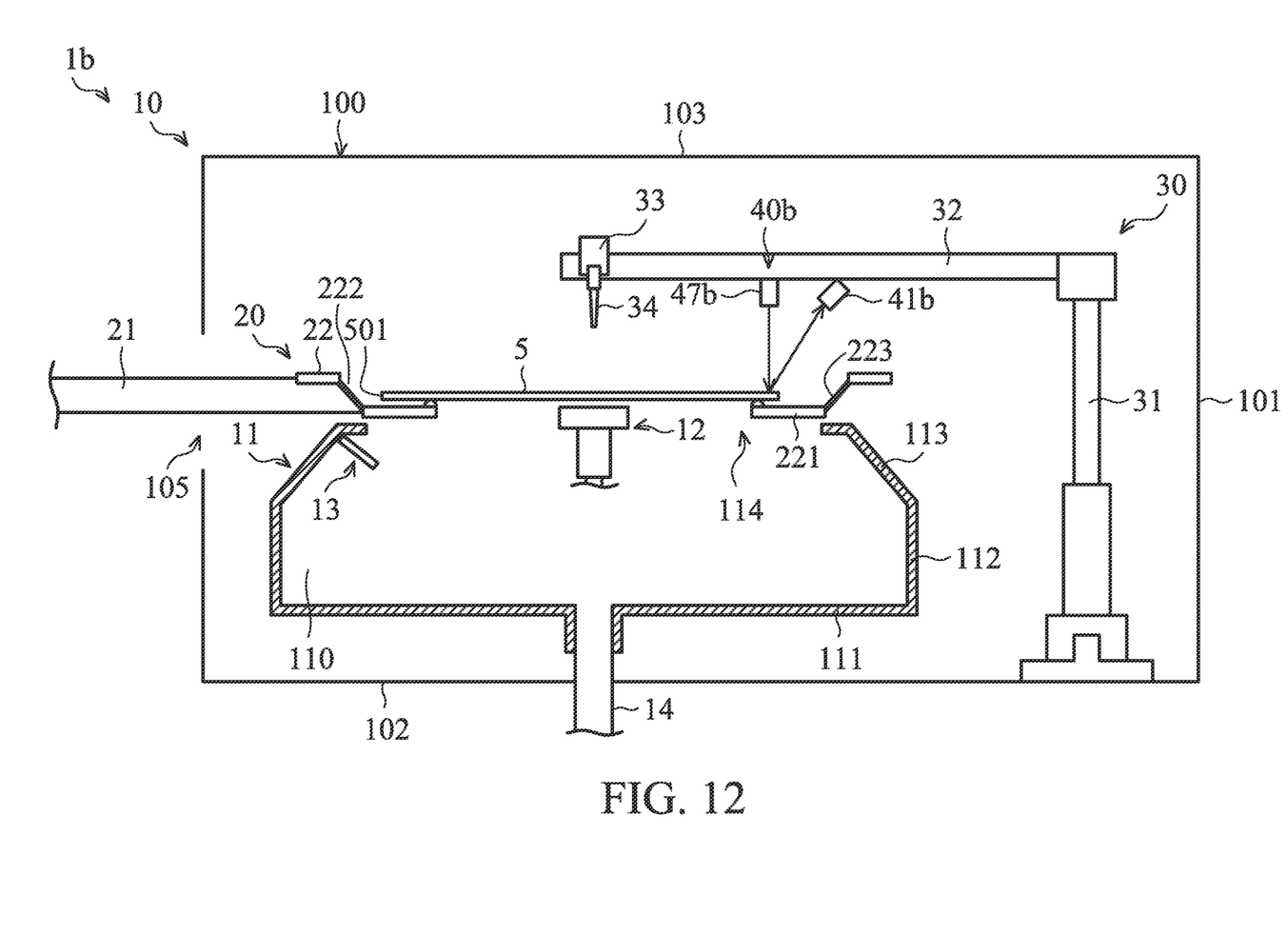
FIG. 12 is a cross-sectional view of a wafer processing system, in accordance with some embodiments.

FIG. 12 shows a cross-sectional view of a wafer processing system 1b, in accordance with some embodiments. In some embodiments, differences between the wafer processing system 1b and the wafer processing system 1 shown in FIG. 1 include the monitoring module 40 being substituted by a monitoring module 40b.

The monitoring module 40b includes an optical receiver 41b, an image processor (not shown in FIG. 12), an image display (not shown in FIG. 12), and a projector 47b, in accordance with some embodiments. In some embodiments, the optical receiver 41b and the projector 47b are mounted on the second drive mechanism 32 of the dispensing module 30.

To record an image feature in relation to the wafer 5, the projector 47b emits a radiation beam toward to the robot blade 22 with the wafer 5 loaded thereon, and the optical receiver 41b receives an image feature in relation to the wafer 5 for image analyses. In the embodiments, the image feature is a reflected radiation reflected from the wafer 5 or the robot blade 22. The image processor analyzes the shape of the reflected radiation to determine if the wafer 5 is positioned or centered. For example, if the shape of the reflected radiation is a circle, and the image processor determines the wafer 5 is positioned relative to the wafer stage 12. On the other hand, if the shape of the reflected radiation is not a circle, and the image processor determines the wafer 5 is not positioned relative to the wafer stage 12. The radiation beam may be an X-ray, an infrared ray, or any other suitable radiation ray.

Embodiments of method for wafer positioning are provided. An image feature of a wafer is recorded as the wafer is transferred into a processing chamber. A shifting value needed to move the wafer to the correct position is calculated with a real-time analysis of the image feature. Therefore, the wafer is positioned and ready to be processed. In addition, since the wafer is processed in the correct position, the gross dies of the semiconductor wafer are increased. In addition, compared with manually positioning the wafer, the time needed to position the wafer is reduced or eliminated, the processing time is reduced, and productivity is increased.

In accordance with some embodiments, a method for processing a wafer in semiconductor fabrication is provided. The method includes transmitting first positioning data to a transferring module to enable the transferring module to send the wafer into a processing chamber. The method further includes recording an image feature in relation to the wafer. The method further also includes determining second positioning data based on the image feature. In addition, the method includes transmitting the second positioning data to the transferring module to enable the transferring module to place the wafer in a processing position. Additionally, the method includes performing a processing operation over the wafer which is located in the processing position.

In accordance with some embodiments, a method for positioning a wafer in semiconductor fabrication is provided. The method includes sending a wafer into a processing chamber by a transferring module. The method further includes producing a video image in relation to an edge of the wafer by a monitoring module. The method also includes performing an image analysis on the video image to determine if the edge of the wafer is in the correct position. If the edge of the wafer is not in the correct position, calculating a shifting value and moving the wafer according to the shifting value.

In accordance with some embodiments, a system for positioning a wafer in semiconductor fabrication is provided. The system includes a processing chamber. The system further includes a transferring module. The transferring module is used to transfer the wafer to the processing chamber or to transfer the wafer from the processing chamber. The system also includes an optical receiver. The optical receiver is positioned in the processing chamber. When the wafer is transferred into the processing, the optical receiver is used to record an image feature in relation to an edge of the wafer. In addition, the system includes an image processor. The image processor is used to analyze the image feature recorded by the optical receiver. Afterward, the image processor outputs adjusted positioning data to the transferring module to enable the transferring module to place the wafer into the processing position.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing a wafer, comprising:
   placing the wafer on a transferring module having two wafer blocks portions, wherein the distance between the first of the wafer block portion and the edge of the wafer is shorter than the distance between the second of the wafer block portion and the edge of the wafer;
   transmitting a first positioning data to the transferring module to enable the transferring module to send the wafer into a processing chamber;
   recording an image feature in relation to the wafer;
   determining a second positioning data based on the image feature;
   transmitting the second positioning data to the transferring module to enable the transferring module to place the wafer in a processing position; and
   performing a processing operation over the wafer which is located in the processing position.

2. The method as claimed in claim 1, wherein the image feature comprises a video image in relation to an edge of the wafer.

3. The method as claimed in claim 2, wherein the video image is produced by a CCD (Charge-coupled Device).

4. The method as claimed in claim 1, further comprising projecting a radiation beam toward the transferring module with the wafer mounted thereon, wherein the image feature comprises an image that shows the shape of the reflected radiation beam.

5. The method as claimed in claim 1, wherein during the operation of recording an image feature in relation to the wafer, the wafer is held by a robot blade in the processing chamber.

6. The method as claimed in claim 1, wherein when the wafer is placed in the processing position, a center of the wafer is aligned with a chucking unit configured to fix the wafer.

7. The method as claimed in claim 1, further comprising analyzing the image feature and producing a shifting value, wherein the second positioning data is equal to the sum of the first positioning data and the shifting value.

8. The method as claimed in claim 1, wherein the processing operation comprises supplying a washing liquid over a peripheral area of the wafer.

9. The method as claimed in claim 8, wherein the peripheral area has a width ranged from about 1 mm to about 2 mm.

10. The method as claimed in claim 1, wherein the processing operation comprises supplying a photoresist over the wafer from a dispending nozzle, and the image feature is recorded by an optical receiver, wherein the dispending nozzle and the optical receiver are moved in the processing chamber by a dispensing module.

11. The method as claimed in claim 1, further comprising recording image features in relation to different regions of the wafer and determining the second positioning data based on the image features.

12. A method for positioning a wafer, comprising:
sending a wafer into a processing chamber by a transferring module;
producing a video image in relation to the wafer by a monitoring module;
performing an image analysis on the video image to determine if the wafer is in a correct position;
if the wafer is not in the correct position, calculating a shifting value and moving the wafer according to the shifting value;
wherein during the operation of moving the wafer according to the shifting value, the monitoring module continuously produces real-time video images for image analysis.

13. The method as claimed in claim 12, wherein the image analysis comprises determining if an edge of the wafer shown in the video image overlaps a reference line shown in a template image which designates a correct position.

14. The method as claimed in claim 13, wherein the reference line is a curve line, and the edge of the wafer has a shape that is compatible with the curve line.

15. The method as claimed in claim 12, wherein the video image is captured by a CCD (Charge-coupled Device) disposed in the processing chamber.

16. The method as claimed in claim 12, further comprising producing video images in relation to different regions by different optical receivers of the monitoring module and performing the image analysis on the video images.

17. The method as claimed in claim 12, further comprising placing the wafer on a transferring module having two wafer blocks portions, wherein the distance between the first of the wafer block portion and the edge of the wafer is shorter than the distance between the second of the wafer block portion and the edge of the wafer.

18. The method as claimed in claim 12, further comprising performing a processing operation over the wafer which is located in the correct position, wherein the processing operation comprises supplying a photoresist over the wafer from a dispending nozzle and supplying a washing liquid over a peripheral area of the wafer.

* * * * *